Figure 1:
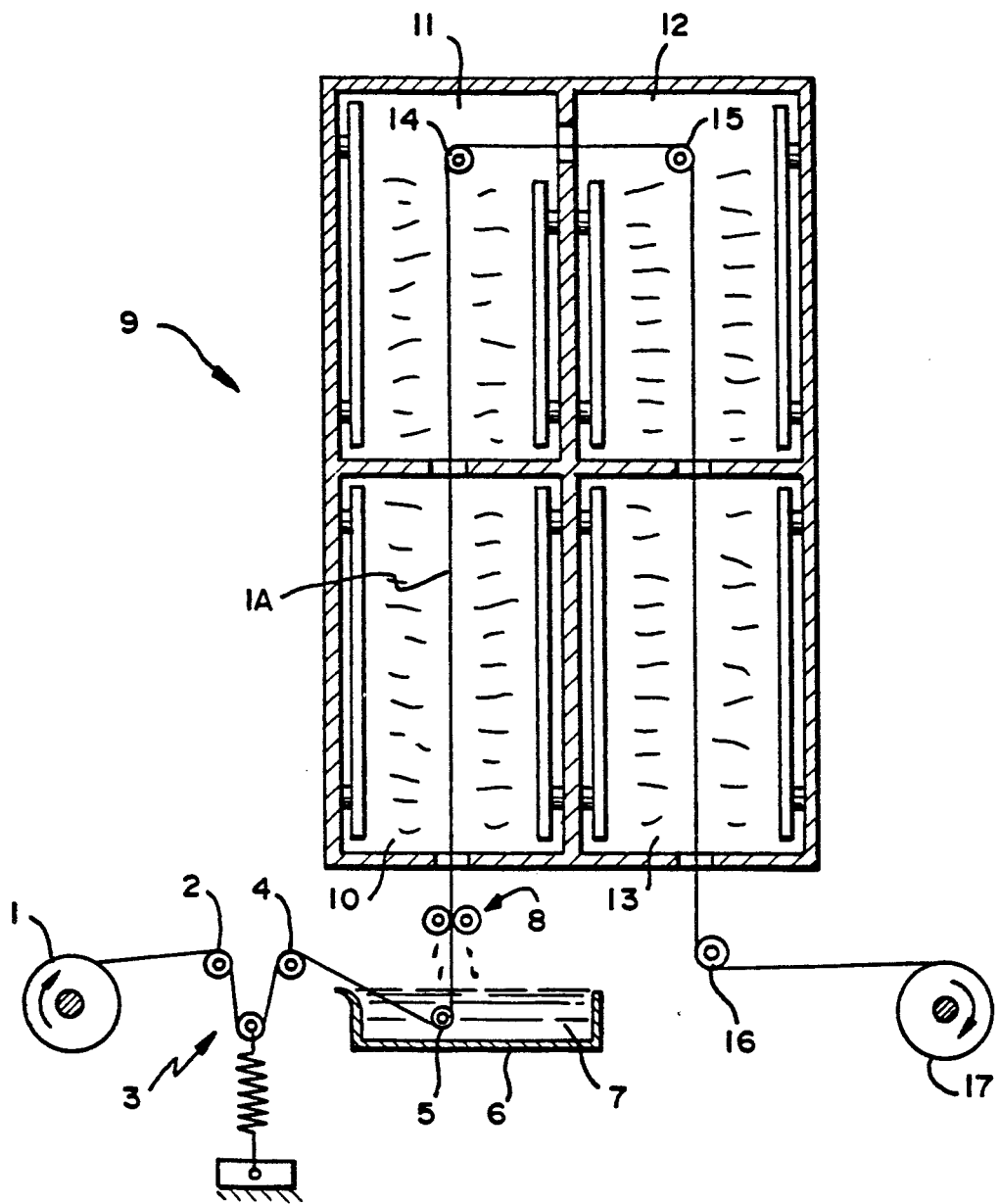

United States Patent [19]
Cibulsky et al.

[11] Patent Number: 5,143,756
[45] Date of Patent: Sep. 1, 1992

[54] FIBER REINFORCED EPOXY PREPREG AND FABRICATION THEREOF

[75] Inventors: Michael J. Cibulsky, Binghamton; Kostas Papathomas, Endicott; George P. Schmitt, Vestal, all of N.Y.

[73] Assignee: International Business Machines Corporation, Armonk, N.Y.

[21] Appl. No.: 572,554

[22] Filed: Aug. 27, 1990

[51] Int. Cl.$^5$ .............................................. B05D 3/02
[52] U.S. Cl. .................................. 427/386; 427/389.8; 427/393.5; 428/224
[58] Field of Search .................. 156/166; 427/96, 386, 427/389.8, 393.5; 428/224

[56] References Cited

U.S. PATENT DOCUMENTS

| | | | |
|---|---|---|---|
| 3,523,037 | 8/1970 | Chellis | 117/119.6 |
| 3,631,150 | 12/1971 | Green | 260/47 |
| 3,655,617 | 4/1972 | Imoehl et al. | 260/47 |
| 4,024,305 | 5/1972 | Alpaugh et al. | 427/381 |
| 4,066,625 | 1/1978 | Bolger | 260/59 |
| 4,327,143 | 4/1982 | Alvino et al. | 428/236 |
| 4,421,877 | 12/1983 | Alvino | 523/414 |
| 4,452,847 | 6/1984 | Siemon | 428/246 |
| 4,501,787 | 2/1985 | Marchetti et al. | 428/236 |
| 4,517,321 | 5/1985 | Gardner et al. | 523/400 |
| 4,567,094 | 1/1986 | Levin | 428/256 |
| 4,590,122 | 5/1986 | Levin | 428/260 |
| 4,621,128 | 11/1986 | von Seyerl | 528/93 |
| 4,710,429 | 12/1987 | Bogan et al. | 428/417 |
| 4,760,106 | 7/1988 | Gardner et al. | 523/433 |

FOREIGN PATENT DOCUMENTS 397241 2/1966 Switzerland .

OTHER PUBLICATIONS

Chemical Abstract, 122376v, (1986).
Chemical Abstract, 89-14778f.
Bhatt et al., "Eliminating Dicyandiamide Crystals in Epoxy Glass Prepreg", IBM Technical Disclosure Bulletin, vol. 29, No. 8, Jan. 1987, pp. 3311-3314.
Eggers et al., "Fabrication of Void-Dicy-Crystal-Free Epoxy Prepreg Using a Modified FR-4 Epoxy Resin System", IBM Technical Disclosure Bulletin, vol. 29, No. 11, Apr. 1987, p. 4884.
Feger et al., "Detection of Imcompletely Reacted Curing Agent in Epoxy/Glass Laminates Using UV--Fluorescent Staining Agent", IBM Technical Disclosure Bulletin, vol. 29, No. 6, Nov. 1986, pp. 2504-2505.
Schneider et al., "DSC and TBA Studies of the Curing Behavior of Two Dicy-Containing Epoxy Resins", Polymer Engineering and Science, Mar. 1979, vol. 19, No. 4, pp. 304-312.
Senich et al., "A Dynamic Mechanical Study of the Curing Reaction of Two Epoxy Resins", Polymer Engineering and Science, Mar. 1979, vol. 19, No. 4, pp. 313-318.

Primary Examiner—Michael Lusignan
Attorney, Agent, or Firm—Pollock, Vande Sande & Priddy

[57] ABSTRACT

A dicyandiamide crosslinked epoxy prepreg substantially free from dicyandiamide crystals is obtained by subjecting an epoxy composition containing dicyandiamide to elevated temperature to thereby form a substantially prereacted product, adding solvents if desired, desolvating, and then thermally advancing the prereacted product to the desired state of crosslinking to thereby form the prepreg.

18 Claims, 1 Drawing Sheet

FIBER REINFORCED EPOXY PREPREG AND FABRICATION THEREOF

TECHNICAL FIELD

The present invention is concerned with a process for fabricating a fiber reinforced epoxy prepreg employing dicyandiamide crosslinking agent and whereby the prepreg is substantially free of dicyandiamide crystals. In addition, the present invention is concerned with fiber reinforced epoxy prepreg composites that employ dicyandiamide crosslinking agent and yet are substantially free from dicyandiamide crystals.

Background Art

Circuit boards find a wide variety of uses in the electrical industry such as for computers, radios, televisions, appliances, and various electrical apparatus. A widely employed technique for preparing circuit boards is to impregnate a woven fiberglass sheet with a resin composition and then laminate a copper sheet to one or both sides of the resin impregnated fiberglass sheet. Next, an electrical circuit is etched into the copper to form the circuit board and then electrical connections can be soldered to the board when it is used.

Various resins have been suggested for the purpose of impregnating the fiberglass to prepare the circuit boards. For example, various epoxy polymers are used for such purposes including epoxy polymer compositions containing dicyandiamide as crosslinking agent. In particular, see U.S. Pat. No. 3,523,037 to Chellis and assigned to International Business Machines Corporation, the assignee of the present application, and disclosure of which is incorporated herein by reference.

Although the epoxy prepregs disclosed in U.S. Pat. No. 3,523,037 are quite satisfactory, certain problems still exist. For instance, one of the most common problems in the fabrication of dicyandiamide crosslinked epoxy prepregs is the recrystallization of dicyandiamide along the fiber bundles such as the glass bundles of the reinforcing fabric. Rod-like laminate voids can possibly result from these crystals if the dicyandiamide therein fails to react with the epoxy resin in the immediate vicinity. Dicyandiamide is also known to have limited solubility in the epoxy thus hindering its migration to areas depleted from dicyandiamide. It has also been suggested that some electrical failures in circuit boards may have been caused by large concentrations of dicyandiamide crystals in the laminates. This problem with dicyandiamide is especially troublesome since the dicyandiamide tends to crystallize out of the epoxy composition at relatively low heating rates. On the other hand, with the use of relatively high heating rates, loss of control of the degree of reaction or crosslinking occurs, skinning and blister formation also occurs. Accordingly, substantial if not entire elimination of dicyandiamide crystals would be desirable.

SUMMARY OF INVENTION

An objective of the present invention is at least the substantial, if not entire, elimination of recrystallization of dicyandiamide in the fabrication of fiber reinforced epoxy prepregs.

In particular, the present invention is concerned with a method for fabricating a fiber reinforced epoxy prepreg containing dicyandiamide. The method includes obtaining a curable epoxy composition that contains dicyandiamide in an effective crosslinking amount and a curable epoxy material. The base resin can be an epoxy polymer, epoxy polymer precursor or mixtures thereof. The curable epoxy composition is subjected to elevated temperature to form a substantially prereacted product. The reinforcing fiber is impregnated with the prereacted product, which after disolvation, is thermally advanced to the desired state of crosslinking to form the prepreg.

In addition, the present invention is concerned with reinforced epoxy prepreg composites obtained by the above process.

Another aspect of the present invention is directed to fiber reinforced epoxy prepreg containing fibers impregnated with a dicyandiamide crosslinked epoxy polymer composition and being substantially free from dicyandiamide crystals.

BREIF DESCRIPTION OF THE DRAWING

FIG. 1 is directed to an apparatus for impregnating fabric with an epoxy resin composition and for partially curing the epoxy resin impregnated fabric.

BEST AND VARIOUS MODES FOR CARRYING OUT INVENTION

The epoxy compositions employed pursuant to the present invention require dicyandiamide crosslinking agent and a curable epoxy material. Typical epoxy resins include the bisphenol A type resins obtained from bisphenol A and epichlorohydrin, resinous materials obtained by the epoxidation of novolak resins produced from a phenolic material such as phenol or cresol and an aldehyde such as formaldehyde with epichlorohydrin, polyfunctional epoxy resins such as tetraglycidyl-diaminodiphenyl methane polyglycidyl ethers of tetraphenylene. The preferred epoxy compositions contain at least one tetrabrominated diglycidyl ether of bisphenol A. The tetrabrominated diglycidyl ethers of bisphenol A are well-known and commercially available. Such can be obtained by reacting tetrabrominated bisphenol A with a halo-epoxy alkane, namely epichlorohydrin.

A typical tetrabrominated diglycidyl ether of bisphenol A employed pursuant to the present invention is a polyglycidyl ether of tetrabromo bisphenol A, prepared from tetrabromo bisphenol A and epichlorhydrin. It has a functionally of about 2, an epoxide equivalent weight about 455 to 500 and a bromine content of about 19% to 23% by weight. It is supplied by the Ciba-Geigy under the trade name Araldite 8011, as a solution containing 75 percent epoxy resin by weight in methyl ethyl ketone (MEK) or by Dow Chemical Co. under the trade name DER-511, as an 80% solution in methyl ethyl ketone.

According to preferred aspects of the present invention, the epoxy material also includes an epoxidized novolac such as ECN-1280 (an epoxidized cresol novolac) from Ciba-Geigy, or other higher-functionality epoxy resin.

In such preferred compositions, the amount of the brominated epoxy polymer is about 70 to about 90 parts per hundred parts of epoxy polymer solids and the amount of epoxidized novolac polymer is about 10 to about 30 parts per hundred parts of epoxy polymer solids.

In addition, the epoxy compositions employed pursuant to the present invention must contain dicyandiamide (cyanoguanidine) crosslinking agent in an amount sufficient to crosslink the requirement of the epoxide functional groups. In particular, at the present time, the amount of dicyandiamide utilized in epoxy formulations such as FR-4 formulations is less than the amount needed to combine with the epoxide functional groups present, since as discussed above, the dicyandiamide is so difficult to keep in solution with the epoxy. As much as half of the epoxide functional groups may therefore react via homopolymerization. This is a chain extension reaction rather than a crosslinking reaction. By permitting an amount of dicyandiamide closer to the stoichiometric requirement to be put into the formulation it is possible to raise the glass transition temperature (Tg) of the cured composite by increasing the crosslink density. According to preferred aspects of the present invention, the amount of dicyandiamide is about 40 to about 80 percent of the stoichiometric amount for combining with the epoxide functional groups of the epoxy material.

The composition also preferably is in the form of a liquid preparation in an organic solvent to facilitate the subsequent impregnation.

Ethylene glycol monomethyl ether (EGME) and methyl ethyl ketone serve as the preferred solvents for the epoxy material and dicyandiamide and maintain the desired viscosity for impregnation which is usually about 35 to about 100 and preferably about 40 to about 60 centipoise at normal room temperatures. While ethylene glycol monomethyl ether and methyl ethyl ketone are the solvents of choice, other, suitable solvents may also be used. The solvent is present in amounts of about 35 to about 55 parts, and preferably about 40 to about 50 parts by weight per 100 parts of the solid materials in the composition. Moreover, the present invention makes it possible to use reduced amounts of the ethylene glycol monomethyl ether. This is significant in view of the toxicity concerns when using ethylene glycol monomethyl ether.

In addition, if desired the compositions can include catalysts or accelerating agents. The accelerating agent includes such known agents for epoxy polymers as the imide-, imine-, and amine-type agents. Examples of some suitable imides include 2-methylimidazole; and 2,4 methyl ethyl imidazole (EMI-24). Examples of some suitable amines include diethylenetriamine, 2,4,6-tris-N,N'-dimethylaminoethyl phenol, triethylenetetramine, tetraethylenepentamine, benzyl dimethylamine, α-methylbenzyldimethylamine, dimethylaminomethylphenol, and 1,3-bis(dimethylamino)butane.

When employed, the catalyst or accelerating agent is generally used in amounts of about 0.1 to about 0.5, and preferably about 0.1 to about 0.3 by weight per hundred parts of epoxy solids.

In view of the process of the present invention, the use of catalysts are not necessary but can be employed, if desired, as disclosed above. In addition, when such are used, the amounts are generally less than experienced in the prior art.

According to the present invention, the curable epoxy composition is subjected to elevated temperatures to thereby form a substantially prereacted product and in particular to react at least one of the active protons of a major portion (e.g. - at least about 25% and preferably at least about 35% to about 50%) of the dicyandiamide molecules. The reaction can be carried out to the extent that about 40% to about 50% of the starting dicyandiamide is chemically bound to the base resin.

The prereaction is usually carried out at temperatures of about 100° C. to about 120° C., preferably about 110° C. to about 115° C. and most preferably under reflux. Typically, the prereaction is carried out for about 60 to about 120 minutes and preferably about 75 to about 90 minutes, typical of which being about 90 minutes.

The prereacted product is then used to impregnate the fiber reinforcement material. The compositions can be used to coat and/or impregnate fibrous substrates such as fiberglass, polyaramids, polytetrafluoroethylene, and graphite. The amount of the epoxy composition is usually about 30% to about 70% by weight and preferably about 50% to about 65% by weight of the total solids content of the epoxy composition and fibrous substrate.

The impregnating operation can be performed according to FIG. 1. A roll of woven glass fabric 1, commonly 2 mils to 10 mils in thickness, is threaded over guide roll 2, under a tension roll 3 and over a second guide roll 4. A third guide roll 5 directs the web of fabric into a pan 6 containing the prereacted epoxy resin solution 7 where the fabric 1A is impregnated with the same. After being impregnated, the fabric 1A passes through a pair of doctor rolls 8 where excess epoxy resin solution is removed from the surfaces of the web 1 and dropped back into pan 6. The amount of resin solution weight pickup can be varied by moving the rolls 8 toward or away from the web by a few tenths of a mil. The web 1A then passes into an oven, generally designated as 9. The oven is typically comprised of two to four individual chambers such as 10, 11, 12 and 13, each chamber being heated separately and at different temperatures. Each chamber also contains a blower (not shown) to circulate hot air over the surfaces of the web 1A. The chambers 10 and 11 are heated to provide a temperature gradient of from 250° F. to 320° F. so that as the web 1A passes therethrough, the solvents, e.g.—methyl ethyl ketone and ethylene glycol monomethyl ether, are removed from said web 1A, leaving only the resinous material behind. Chambers 12 and 13 are heated so that a temperature gradient of from 300° F. to 350° F. is maintained. As the web 1A passes over turn around rolls (14 and 15) and pass through these chambers (12 and 13), the epoxy resin residue is polymerized to a desired state of partial cure. This state of curing is obtained by determining resin flow when a predetermined number of sheets of the impregnated fabric (prepreg) are pressed at a temperature of 340±5° F. and 300 p.s.i. for 10 minutes. Web 1A then passes out of the oven 9 to web drive 16 and finally onto a driven, variable-speed windup roll 17. Wind-up roll 17 allows one to control the speed and tension of the fabric going through the oven.

The process of the present invention makes it possible to reduce the time needed for the crosslinking reaction to form the prepreg or B stage. In particular, times of about 2 minutes to about 5 minutes are preferably used pursuant to the present invention, of course, longer times can be used such as about 5 to about 7 minutes, if desired.

By employing the process of the present invention, the problem of crystallization of dicyandiamide is eliminated or at least significantly reduced.

The following solubility data demonstrates the ability to reduce the amount of ethylene glycol monomethyl ether employed in the composition. By way of example, the total amount of dicyandiamide employed in the composition in Example 2 below is 3% by weight. Since the ethylene glycol monomethyl ether content is about 55% and methyl ethyl ketone is about 45%, the concentration of dicyandiamide in the ethylene glycol monomethyl ether is about 5.5%.

By prereacting the dicyandiamide, the amount of free dicyandiamide can be significantly reduced such as by about 50%. The remaining dicyandiamide is covalently bonded to the epoxy polymer and can be easily solubilized by the methylethylketone. Accordingly, when using 3% dicyandiamide, the remaining free dicyandiamide in the composition will be about 1.5%. This results in this typical example (i.e.—55% ethylene glycol monomethyl ether) in a concentration of free dicyandiamide in ethylene glycol monomethylether of 2.7% or less as contrasted to non-prereacted composition wherein the concentration is 5.5%. the following table of solubility data illustrates that an overall reduction in the ethylene glycol monomethyl ether of about 55% is possible.

| EGME/MEK | Wt of dicyandiamide | Solubility | % Dicyandiamide in EGME content |
| --- | --- | --- | --- |
| 5/0 (ml) | 0.15 gr | soluble | 3.0% |
| 10/0 (ml) | 0.15 gr | soluble | 1.5% |
| 10/0 (ml) | 0.82 gr | soluble | 8.0% |
| 5/5 (ml) | 0.15 gr | soluble | 3.0% |
| 3/7 (ml) | 0.15 gr | soluble | 5.0% |
| 2/8 (ml) | 0.15 gr | soluble | 7.5% |
| 1/9 (ml) | 0.15 gr | not soluble | 15.0% |

After the prepreg is formed, a sheet of copper or other conductive material can then be laminated to one or more layer of prepreg using laminating conditions such as about 100 to about 500 pounds per square inch, about 150° C. to 200° C. for about 30 minutes to about 2 hours. Then a circuit can be etched to the conductive layer using techniques well-known to form circuit boards.

The following non-limiting examples are presented to further illustrate the present invention.

EXAMPLE 1

An epoxy composition containing about 51.0 parts by weight of a mixture of 45.5 parts by weight brominated bisphenol A diglycidyl ether (Araldite 8011) and about 6.5 parts by weight of epoxidized cresol novolac (ECN 1280) dissolved in about 6.0 parts of methyl ethyl ketone, about 1.5 parts by weight of dicyandiamide, about 25.5 parts by weight of ethylene glycol monomethyl ether, and about 0.005 parts by weight of 2-methyl imidazole is refluxed at 109° C.

The mixture is refluxed at 109.C for a total time of 90 minutes. Reaction aliquots were taken at 0, 15, 30, 60 and 90 minutes. The concentration of dicyandiamide during the partial reaction is determined by a high pressure liquid chromatographic (HPLC) technique defined below. The amount of free dicyandiamide remaining after 90 minutes was 55% of the original amount used in the reaction. Samples taken after 15 and 30 minutes refluxing exhibit rapid formation of needle-like dicyandiamide crystals whereas samples taken at 90 minutes remain free of dicyandiamide crystals for at least 5 days.

Glass transition temperatures measured on cured samples give Tg values in the range of 130.C (comparable to those obtained from the prior art process). After 90 minutes of refluxing the solution became more viscous.

Liquid Chromatographic Procedure for Free Dicyandiamide

Changes in the free dicyandiamide is monitored with an HP photodiode array detector attached to an IBM Instruments LC9533 ternary liquid chromatograph. The chromatographic signal used is the one obtained at 230 nm. A 30 cm×3.9 mm ID-reverse phase C18 column from IBM Instruments is used and manual injections using a 20 microliter size loop are made. All solvents used in the HPLC studies are Burdick and Jackson distilled in glass grade and are filtered through 0.50 $\mu$m Millipore membrane filters prior to use as mobile phases. Deionized water is purified to HPLC grade water using a Millipore Norganic filtration system and filtered through a .45 micron filter immediately prior to use. The mobile phase is programmed with a linear gradient form (40/60) tetrahydrofuran/water to 100% tetrahydrofuran over a period of 40 minutes at a flow rate of 2.0 ml/min. Dicyandiamide elutes at a retention time of 1.43 minutes. A series of dicyandiamide solutions in methyl ethyl ketone are run by HPLC using the method described above to obtain a calibration plot. The plot is linear within the range of testing. Reaction aliquots are taken at various intervals and tested for the unreacted dicyandiamide in the solution.

A sample from each aliquot taken at various intervals is placed on a glass slide and the solvent evaporated at room temperature or high vacuum. The slides then are examined under a polarized light microscope for the presence of dicyandiamide crystals. Samples from the same aliquots are stripped of solvent under high vacuum and are analyzed using differential scanning calorimetry. The overall heat of reaction evolved during curing is measured using a DuPont 9900 Thermal analyzer. A sample size of approximately 10 mg and a heating rate of 20C/min are used. The residual heat of reaction as a function of reaction time is measured. A reduction in the heat of reaction evolved during the crosslinking process indicates that a 24.5% conversion takes place within 90 minutes of refluxing.

EXAMPLE 2

An epoxy composition containing about 50.3 parts by weight of a mixture of 45 parts by weight brominated bisphenol A diglycidyl ether (Araldite 8011) and about 5.3 parts by weight of epoxidized cresol novolac (ECN 1280) dissolved in about 6.5 parts of methyl ethyl ketone, about 1.6 parts by weight of dicyandiamide, about 27.5 parts by weight of ethylene glycol monomethyl ether, is refluxed at 116.C.

The above composition is heated over a period of about 25 minutes to about 116.C and refluxed at this temperature for a period of about 2.5 hours. Samples are taken at 0, 10, 15 and 2.5 hours, solvent is stripped off under high vacuum and the samples are examined under polarized light. Crystalline dicyandiamide can be detected in the resin or prepreg due to the fact that is displays birefringence when viewed between crossed polars. This technique is used to evaluate the relative amounts of crystalline dicyandiamide as well as the time it takes for them to develop The following table represents the reduction or delay in crystal formation in the resin as a function or reflux time.

| Reflux Time (min) | Time and relative amount of crystals |
| --- | --- |
| 0 minutes | Rapid formation of many crystals. |
| 10 minutes | Free of crystals for 1.5 hours. Crystals form overnight. |
| 15 minutes | Free of crystals for at least 5 hours. Few crystals develop over the weekend. |
| 2.5 hours | Remained clear for at least 5 days. |

It is evident to those skilled in the art that lesser amounts of accelerating agent may be used in the prereaction, as well as changed amounts of solvents, down to and including reaction in the melt. Times and processing conditions will accordingly be altered as a consequence without significantly altering the prereaction product.

What is claimed is:

1. A method for fabricating a fiber reinforced epoxy prepreg containing dicyandiamide which comprises:
   obtaining a curable epoxy composition containing dicyandiamide in an effective crosslinking amount and a curable epoxy material selected from the group of epoxy polymers, epoxy polymer precursors and mixtures thereof;
   subjecting the curable epoxy composition containing dicyandiamide and epoxy material to elevated temperatures to thereby form a substantially prereacted product,
   then impregnating said fiber with said prereacted product;
   and then thermally advancing the prereacted product to the desired state of crosslinking to thereby form the prepreg.

2. The method of claim 1 wherein said fiber is selected from the group of glass fabric, polyaramids, polytetrafluoroethylene, graphite and mixtures thereof.

3. The method of claim 1 wherein said epoxy includes tetrabrominated diglycidyl ether of bisphenol A.

4. The method of claim 1 wherein amount of dicyandiamide is about 40 to about 80 percent of the stoichiometric amount for combining with the epoxide functional groups of the epoxy material.

5. The method of claim 1 wherein the amount of dicyandiamide is about 2 to about 5 parts per 100 of epoxy solids.

6. The method of claim 1 wherein the curable epoxy composition is a liquid preparation in an organic solvent.

7. The method of claim 6 wherein the solvent includes methyl ethyl ketone.

8. The method of claim 7 wherein the solvent also includes ethylene glycol monomethyl ether.

9. The method of claim 1 wherein the curable epoxy composition also includes an accelerating agent.

10. The method of claim 9 wherein the accelerating agent is 2-methylimidazole.

11. The method of claim 1 wherein the elevated temperatures are about 100° C. to about 120° C.

12. The method of claim 6 which is carried out under reflux.

13. The method of claim 12 wherein the reflux is carried out for about 60 to about 90 minutes.

14. The method of claim 11 wherein the subjecting of the epoxy composition to elevated temperatures is carried out for about 60 to about 120 minutes.

15. The method of claim 1 which further comprises adding a solvent to said substantially prereacted product and desolvating after the step of impregnating the fiber with said prereacted product.

16. The method of claim 1 wherein at least one of the active protons of at least about 25% of said dicyandiamide is prereacted to form said substantially prereacted product.

17. The method of claim 1 wherein at least one of the active protons of about 35% to about 50% of said dicyandiamide is prereacted to form said substantially prereacted product.

18. The method of claim 1 wherein said substantially prereacted product contains about 40% to about 50% of said dicyandiamide is chemically bound to said curable epoxy material.

* * * * *